(12) United States Patent
Mizomoto

(10) Patent No.: US 9,362,174 B2
(45) Date of Patent: Jun. 7, 2016

(54) DEVICE WAFER PROCESSING METHOD

(71) Applicant: DISCO CORPORATION, Tokyo (JP)

(72) Inventor: Yasutaka Mizomoto, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/566,915

(22) Filed: Dec. 11, 2014

(65) Prior Publication Data

US 2015/0179521 A1 Jun. 25, 2015

(30) Foreign Application Priority Data

Dec. 19, 2013 (JP) ................................. 2013-262437

(51) Int. Cl.

| H01L 21/00 | (2006.01) |
|---|---|
| H01L 23/34 | (2006.01) |
| H01L 21/78 | (2006.01) |
| H01L 21/683 | (2006.01) |
| H01L 21/304 | (2006.01) |
| H01L 25/04 | (2014.01) |
| H01L 21/67 | (2006.01) |
| H01L 23/00 | (2006.01) |

(52) U.S. Cl.
CPC ............... *H01L 21/78* (2013.01); *H01L 21/304* (2013.01); *H01L 21/3043* (2013.01); *H01L 21/67092* (2013.01); *H01L 21/6835* (2013.01); *H01L 21/6836* (2013.01); *H01L 25/04* (2013.01); *H01L 24/26* (2013.01); *H01L 24/94* (2013.01); *H01L 2221/6834* (2013.01); *H01L 2221/68327* (2013.01); *H01L 2221/68381* (2013.01)

(58) Field of Classification Search
CPC .................. H01L 21/67132; H01L 21/67092; H01L 33/0095; H01L 21/6836; H01L 21/78; H01L 24/94; H01L 21/3043; H01L 25/04; H01L 24/26; B23K 26/4075
See application file for complete search history.

(56) References Cited

U.S. PATENT DOCUMENTS

| 7,888,239 B2* | 2/2011 | Nakamura | ........... B23K 26/009 257/E21.599 |
|---|---|---|---|
| 2003/0224540 A1* | 12/2003 | Watanabe | ............ H01L 21/681 438/7 |
| 2006/0079027 A1 | 4/2006 | Yamada | |
| 2006/0284285 A1 | 12/2006 | Fukazawa | |
| 2008/0251188 A1 | 10/2008 | Sekiya | |

(Continued)

FOREIGN PATENT DOCUMENTS

JP 2003-243483 8/2003

OTHER PUBLICATIONS

U.S. Appl. No. 14/561,941, filed Dec. 5, 2014.

*Primary Examiner* — Alonzo Chambliss
(74) *Attorney, Agent, or Firm* — Greer Burns & Crain Ltd.

(57) ABSTRACT

A device wafer processing method includes, a groove forming step in which grooves with a predetermined depth are formed in the front side of a device wafer; a plate attaching step in which a plate is attached to the front side of the wafer through an adhesive; a grinding step in which the wafer is held by a holding table through the plate so as to expose the back side of the wafer, and the back side is ground to expose the grooves at the back side of the wafer, thereby dividing the wafer to form a plurality of chips. The method further includes: a film attaching step in which a film is attached to the back side of the wafer; and a dicing step in which the film is diced along division lines from the side of the back side of the wafer.

1 Claim, 9 Drawing Sheets

(56) References Cited

U.S. PATENT DOCUMENTS

| | | | |
|---|---|---|---|
| 2008/0293220 A1* | 11/2008 | Nakamura | 438/463 |
| 2010/0022071 A1* | 1/2010 | Arita | H01L 21/3043 438/463 |
| 2010/0041210 A1* | 2/2010 | Hoshino et al. | 438/463 |
| 2011/0287609 A1* | 11/2011 | Kobayashi | 438/464 |
| 2014/0084423 A1* | 3/2014 | Priewasser | 257/619 |
| 2015/0170969 A1 | 6/2015 | Mizomoto | |
| 2015/0179521 A1 | 6/2015 | Mizomoto | |

\* cited by examiner

DEVICE WAFER PROCESSING METHOD

BACKGROUND OF THE INVENTION

1. Field of the Invention

The present invention relates to a method for processing a device wafer having a plurality of devices formed on a front side thereof.

2. Description of the Related Art

At the time of dicing of a device wafer, a dicing tape attached to an annular frame having an opening with an inside diameter greater than the outside diameter of the device wafer which has a plurality of devices formed on the front side thereof, is attached to the back side of the device wafer, whereby the device wafer is mounted to the frame through the dicing tape. Thereafter, the device wafer is divided into chips configured on a device basis. In this manner, the individual chips formed upon the division are prevented from being dispersed, and easy handling of the device wafer before the division and easy handling of the chips after the division are realized (see, for example, Japanese Patent Laid-open No. 2003-243483).

SUMMARY OF THE INVENTION

In a conventional dicing apparatus, however, a frame greater than a device wafer is held and conveyed by conveying means, which causes an increase in apparatus size. Particularly where the device wafer has a large diameter (for example, a diameter of 450 mm), the frame is further enlarged, leading to a larger-sized dicing apparatus. On the other hand, there is a demand for a smaller-sized dicing apparatus.

Accordingly, it is an object of the present invention to provide a device wafer processing method which enables dicing of large-diameter device wafers while using a small-sized dicing apparatus.

In accordance with an aspect of the present invention, there is provided a method of processing a device wafer having devices formed respectively in regions sectioned by a plurality of intersecting division lines on a front side thereof, the method including: a groove forming step of forming grooves along the division lines from the front side of the device wafer, the grooves having a depth of not smaller than a finished thickness of the device wafer; a plate attaching step of attaching a plate to the front side of the device wafer through an adhesive after the groove forming step is conducted; a grinding step of holding the device wafer by a holding table through the plate so as to expose a back side of the device wafer, and grinding the back side of the device wafer by grinding means to thin the device wafer down to the finished thickness, thereby exposing the grooves at the back side of the device wafer and dividing the device wafer into individual chips; a film attaching step of attaching a film to the back side of the device wafer after the grinding step is conducted; a dicing step of dicing, after the film attaching step is conducted, the film along the division lines from the side of the back side of the device wafer so as to form the plurality of chips each having the film attached to a back side thereof; and a picking-up step of picking up the individual chips from the plate after the dicing step is conducted.

Preferably, the adhesive is an adhesive having an adhesive force lowered when an external stimulus is applied thereto, and the chips are picked up after the external stimulus is applied to the adhesive, in the picking-up step. Preferably, in the picking-up step, a first one of the chips is picked up through application of the external stimulus to that region of the adhesive which corresponds to the first one of the chips, and thereafter a second one of the chips that is to be picked up next is picked up through application of the external stimulus to that region of the adhesive which corresponds to the second one of the chips.

According to the method of processing a device wafer in accordance with the described aspect of the invention, the device wafer is attached not to a dicing tape but to a plate, and grinding is conducted in that condition, to divide the device wafer into individual chips. While the annular frame in ordinary use is greater in size than the device wafer, the plate is substantially the same as the device wafer in size. Therefore, an increase in the size of a dicing apparatus can be suppressed, even when the device wafers to be processed are enlarged in diameter. In addition, the plate serves as a protective member for protecting the devices during backside grinding. Therefore, it is unnecessary to especially attach a surface protective member to the device wafer when the device wafer is subjected to a grinding step. This makes it possible to enhance productivity and to reduce processing cost.

An adhesive having an adhesive force lowered when an external stimulus is applied thereto is used as the adhesive, and picking up of each of the chips is conducted after the external stimulus is applied to the adhesive in the picking-up step. This facilitates the picking-up operation.

In the picking-up step, a first chip is picked up through application of an external stimulus to that region of the adhesive which corresponds to the first chip, and thereafter a second chip is picked up through application of the external stimulus to that region of the adhesive which corresponds to the second chip to be picked up next. Thus, the external stimulus is applied only to the chip which is about to be picked up. This makes it possible to prevent the chips yet to be picked up from being peeled and dispersed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
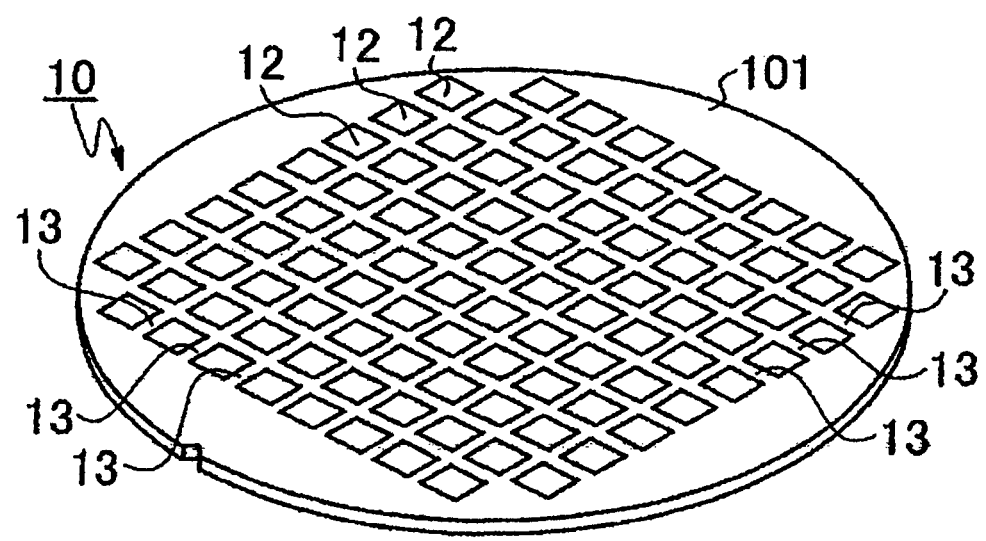
FIG. 1 is a perspective view of a device wafer.

A device wafer 10 depicted in FIG. 1 is formed in a disk shape, and has a plurality of devices 12 formed on a front side 101 thereof. The devices 12 are formed in regions sectioned by a plurality of intersecting division lines 13 on the front side 101. The device wafer 10 is cut along the division lines 13, whereby the device wafer 10 is divided on the basis of each of the devices 12, to form a plurality of chips.

(1) Groove Forming Step

Figure 2:
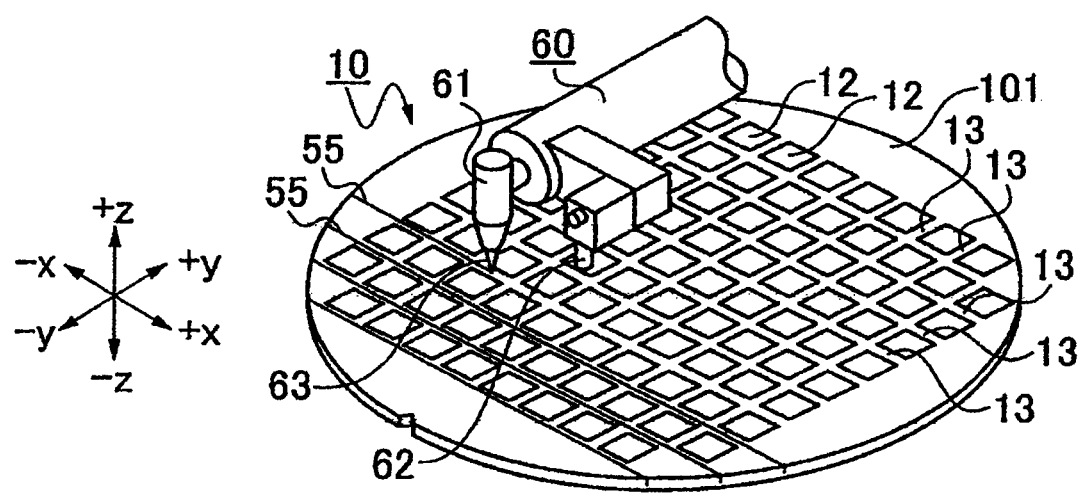
FIG. 2 is a perspective view illustrating a groove forming step.

As shown in FIG. 2, using a laser irradiation apparatus 60 including laser radiating means 61 for radiating a laser beam 63 and imaging means 62 for imaging the front side 101 of the device wafer 10, the division line 13 is detected through imaging by the imaging means 62. While relatively moving the device wafer 10 and the laser radiating means 61 in an X-axis direction, the laser beam having a wavelength that is absorbable by the device wafer 10 is irradiated toward the front side 101 of the device wafer 10, specifically to the position detected. In this manner, ablation is carried out along the division line 13, to form a groove 55.

Figure 3:
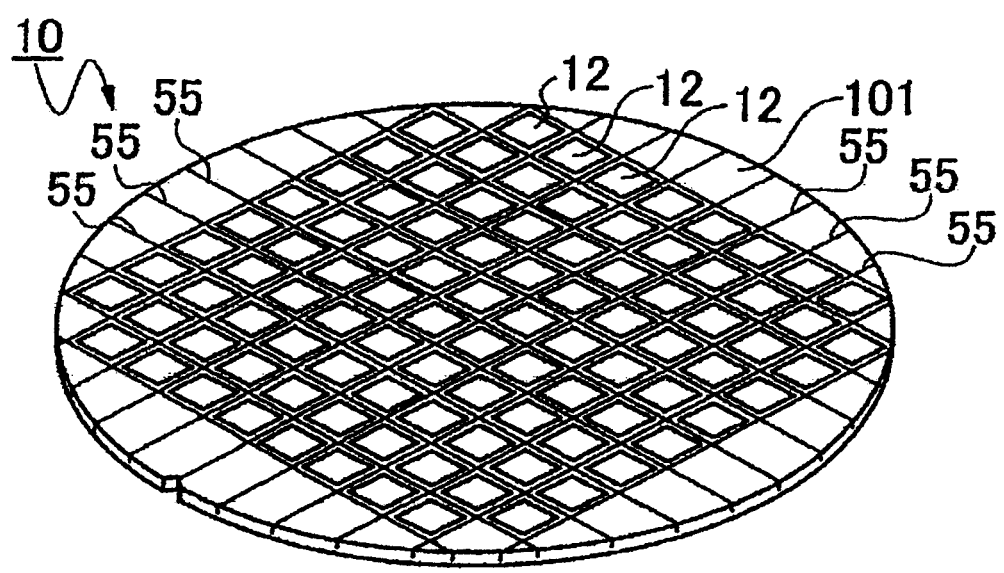
FIG. 3 is a perspective view of the device wafer formed therein with grooves.

The ablation is conducted in the same manner along all the division lines 13, whereby the grooves 55 are formed along all the division lines 13, as illustrated in FIG. 3. The depth of the grooves 55 is so set as to be not smaller than a finished thickness of chips to be formed by division of the device wafer 10. Specifically, the depth is slightly greater than the finished thickness.

(2) Plate Attaching Step

Figure 4:
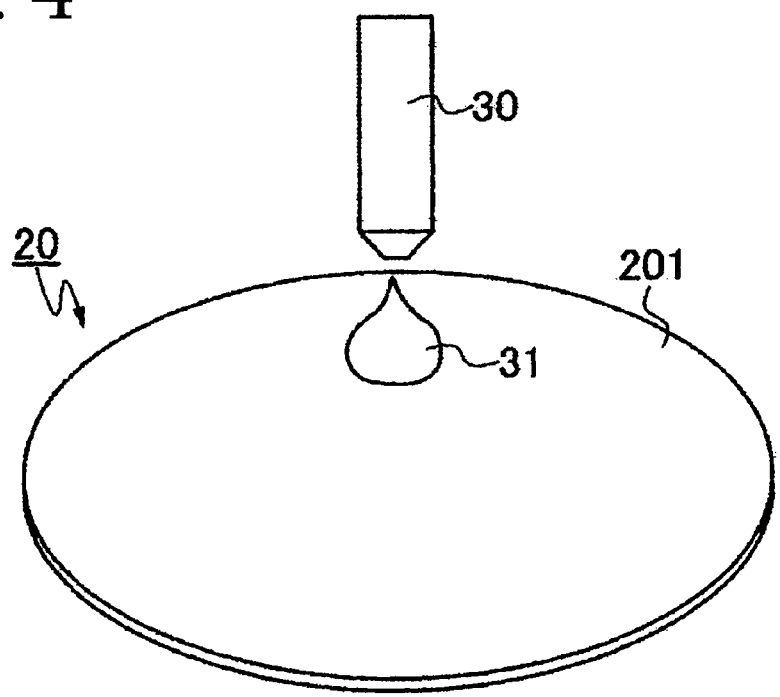
FIG. 4 is a perspective view showing a manner in which an adhesive is applied to a plate.

After the groove forming step is performed, an adhesive 31 is supplied dropwise to a front side 201 of a disk-shaped plate 20 by adhesive applying means 30, as depicted in FIG. 4, and is made to coat the front side 201 by spin coating, for example. The plate 20 is formed from a material (e.g., glass) that does not deform easily and is transmissive to UV (ultraviolet) rays. As the adhesive 31, there is used one whose adhesive force is lowered upon irradiation with UV rays, thereby permitting easy peeling of the adhered matter. For instance, use is made of an adhesive 31 containing mixed therein microcapsules or a foaming agent for expansion or foaming upon irradiation with UV rays. The adhesive applying means 30 may be so configured as to supply dropwise a liquid or gelled adhesive 31 to the plate 20, or may be so configured as to attach a sheet-shaped piece of an adhesive 31 to the front side 201 of the plate 20.

Figure 5:
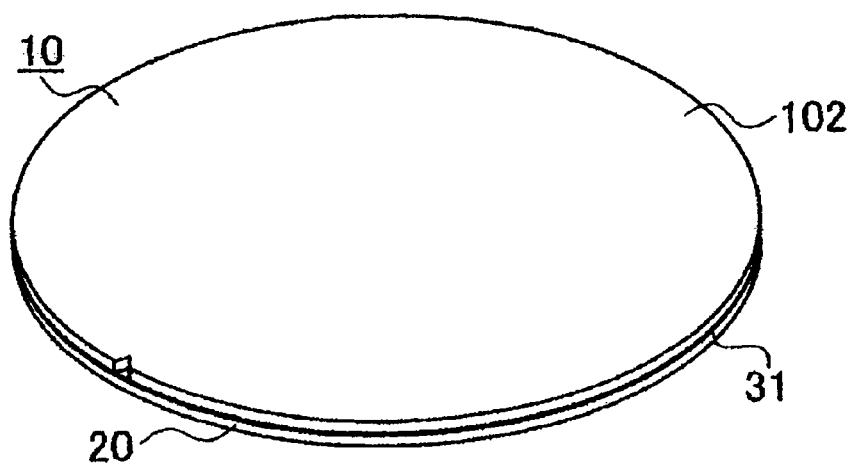
FIG. 5 is a perspective view of the device wafer to which the plate has been attached.

Next, as illustrated in FIG. 5, the device wafer 10 is inverted upside down, and the front side 101 of the device wafer 10 is faced to and attached to the front side 201 of the plate 20, leaving a back side 102 of the device wafer 10 exposed. As a result, the plate 20 is attached to the front side 101 of the device wafer 10 through the adhesive 31.

(3) Grinding Step

Figure 6:
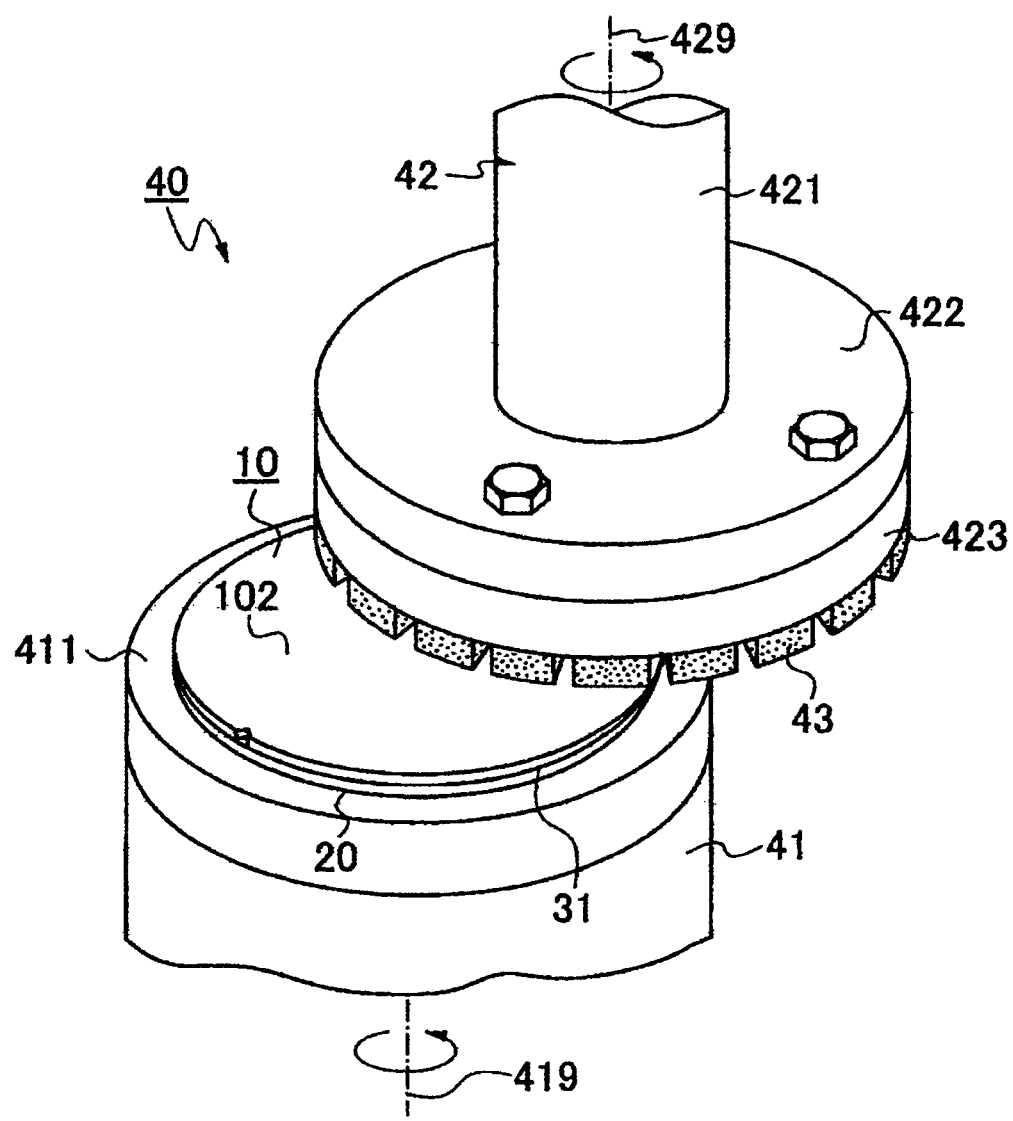
FIG. 6 is a perspective view illustrating a grinding step.

Subsequently, as shown in FIG. 6, use is made of a grinding apparatus 40 including a holding table 41 for holding the device wafer 10 and grinding means 42 for grinding the device wafer 10 held by the holding table 41. The device wafer 10 is mounted on a holding surface 411 of the holding table 41, in such a manner that the side of the plate 20 attached to the device wafer 10 is on the lower side and the back side 102 of the device wafer 10 is exposed, whereby the device wafer 10 is held by the holding table 41 through the plate 20 therebetween.

The grinding means 42 includes a shaft portion (spindle) 421, a mount 422 attached to a lower end of the shaft portion 421, and a grinding wheel 423 which is mounted to the mount 422 and which has a plurality of grindstones 43 fixed in an annular pattern.

While rotating the holding table 41 about a rotation axis 419 and rotating the grindstones 43 mounted in the grinding means 42 about a rotation axis 429, the grindstones 43 are brought into contact with the back side 102 of the device wafer 10, thereby grinding the back side 102 of the device wafer 10. As a result, the device wafer 10 is reduced in thickness. The grinding apparatus 40 grinds the device wafer 10 until the device wafer 10 is thinned down to a finished thickness of chips. Consequently, the grooves 55 formed in the groove forming step are exposed at the back side 102 of the device wafer 10, and the device wafer 10 is divided, to form a plurality of chips.

(4) Film Attaching Step

Figure 7:
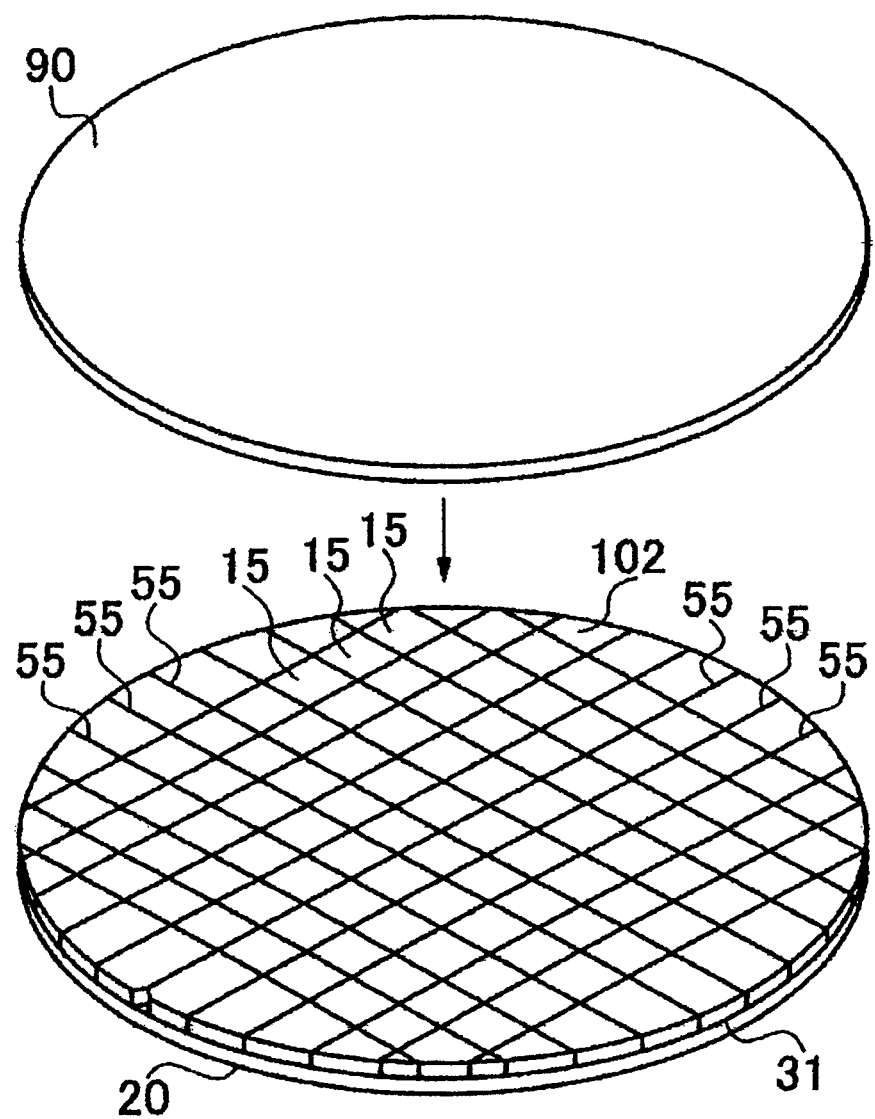
FIG. 7 is a perspective view illustrating a film attaching step.

After the grinding step is carried out, a film 90 such as a die bonding film (DAF: Die Attach Film) or a reinforcement film (DBF: Die Backside Film) is attached to surfaces, on the back side 102, of a plurality of chips 15 formed upon division of the device wafer 10, as depicted in FIG. 7.

(5) Dicing Step

Figure 8:
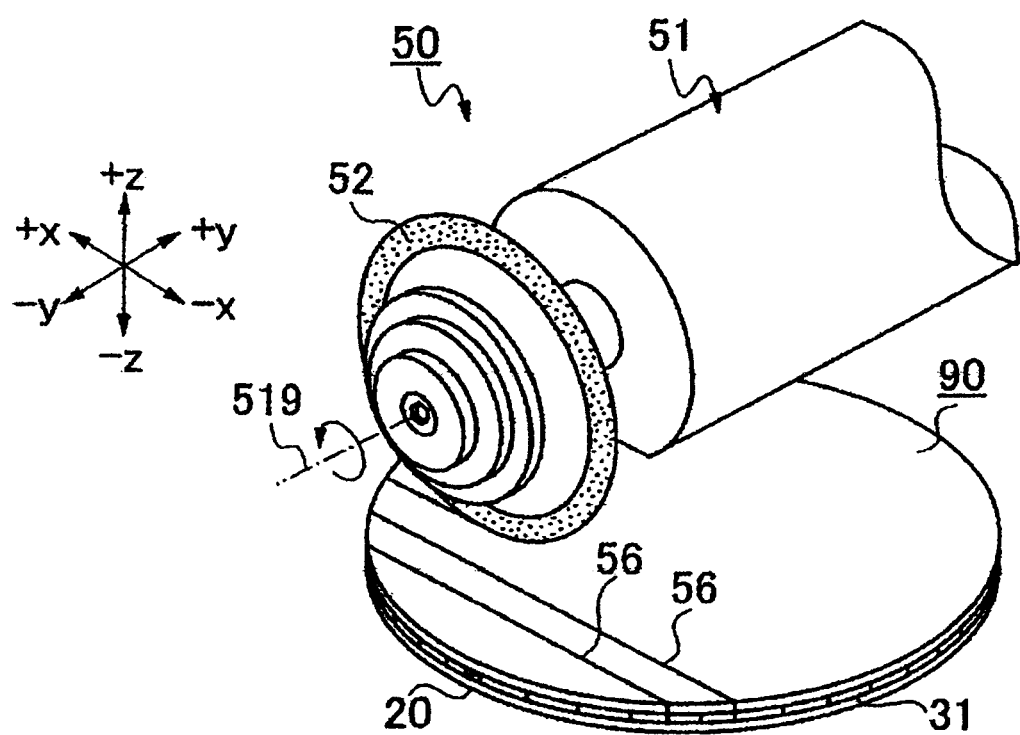
FIG. 8 is a perspective view illustrating a dicing step.

After the film attaching step is performed, the film 90 is divided (diced) by use of a cutting apparatus 50 depicted in FIG. 8. The cutting apparatus 50 includes cutting means 51 having a cutting blade 52 which can be rotated about a rotation axis 519 oriented in a Y-axis direction. While the cutting blade 52 mounted in the cutting means 51 is being rotated about the rotation axis 519, the cutting blade 52 in rotation is made to cut into the film 90 along the division line 13 from the side of the back side 102 of the device wafer 10, thereby dicing the film 90. As a result, the film 90 is divided, and a plurality of chips each having the divided film attached to the back side thereof are formed.

(6) Picking-Up Step

Figure 9:
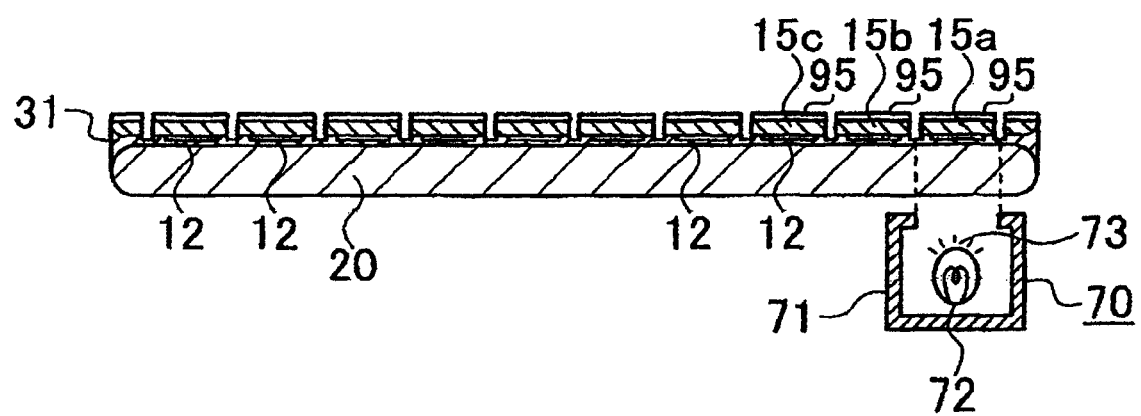
FIG. 9 is a side sectional view showing a manner in which the adhesive force of the adhesive is lowered in a picking-up step.

After the dicing step is carried out, use is made of an external stimulus applying apparatus 70 such as a UV irradiation apparatus wherein a light source 72 such as a light emitting diode for radiating UV rays is provided inside a mask 71, so as to apply an external stimulus to the adhesive 31 and thereby to lower the adhesive force of the adhesive 31, as illustrated in FIG. 9.

The external stimulus applying apparatus 70 irradiates that region of the adhesive 31 which corresponds to one of the chips (e.g., a first chip 15a) with UV rays. The mask 71 intercepts the UV rays radiated from the light source 72 so that the external stimulus is not applied to those regions of the adhesive 31 which correspond to the other chips (e.g., a second chip 15b, a third chip 15c, and so on). The external stimulus applying apparatus 70 may be configured to have a lens for condensing the UV rays radiated from the light source 72 into that region of the adhesive 31 which corresponds to the one of the chips.

Figure 10:
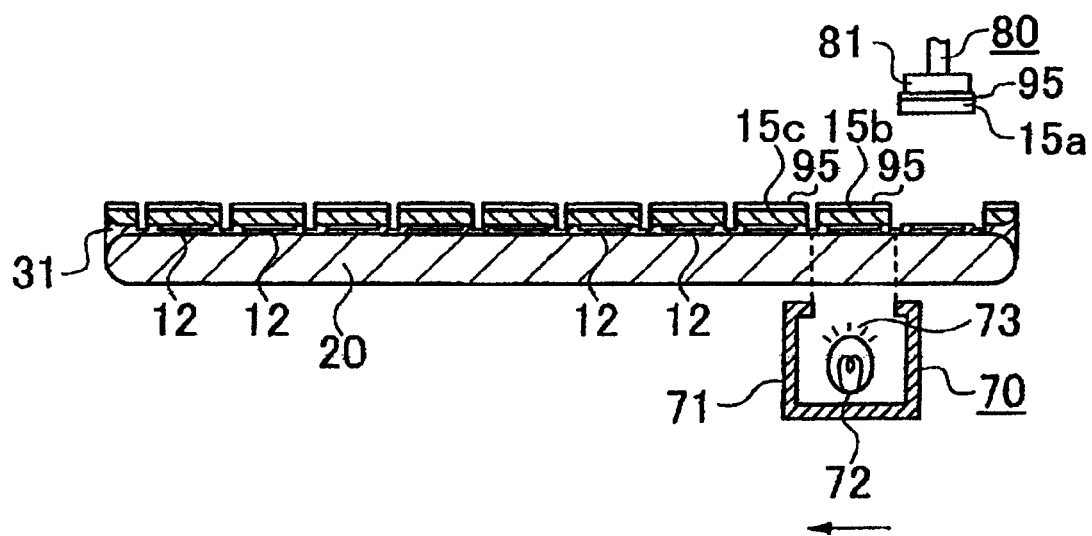
FIG. 10 is a side sectional view showing a manner in which a chip is picked up in the picking-up step.

After that region of the adhesive 31 which corresponds to the first chip 15a is irradiated with UV rays, a picking-up apparatus 80 having a collet 81 is used to pick up from the plate 20 the chip 15a such that the adhesive force of the adhesive 31 has been lowered in the region corresponding to the chip 15a, as shown in FIG. 10. Thereafter, the external stimulus applying apparatus 70 and the device wafer 10 are relatively moved, and the external stimulus applying apparatus 70 applies an external stimulus to that region of the adhesive 31 which corresponds to the second chip 15b to be picked up next. After the second chip 15b is picked up by the picking-up apparatus 80, the external stimulus applying apparatus 70 applies the external stimulus to that region of the adhesive 31 which corresponds to the third chip 15c to be picked up next.

In this way, the chips are sequentially picked up one by one. The external stimulus is applied only to that region of the adhesive 31 which corresponds to one chip, the chip such that the external stimulus has been applied to the region corresponding thereto is picked up, and this process is repeated. This not only facilitates the picking-up operation but also ensures the following. At the time of picking up a chip, the adhesive 31 adhering to the chip about to be picked up has been lowered in adhesive force, so that the chip can be picked up easily. In addition, since the adhesive 31 adhering to the other chips has not been lowered in adhesive force, a risk that those chips which have not yet come to be picked up might be peeled inadvertently and be dispersed can be avoided.

Note that the method of forming the grooves 55 in the groove forming step is not limited to the method of irradiating with the laser beam 63, but other methods can also be used, for example, a method of half-cutting by a cutting blade or a method by plasma etching.

While the adhesive 31 is applied to the plate 20 and the device wafer 10 is attached to the adhesive-coated plate in the plate attaching step mentioned above, the adhesive may be in the form of a sheet. For instance, the adhesive may be in the form of an adhesive double coated tape. In this case, an adhesive layer on one side of the adhesive double coated tape is adhered to the plate 20, whereas an adhesive layer on the other side forms an adhesive surface whose adhesive force is lowered when an external stimulus is applied thereto, and the latter adhesive layer contributes to attaching to the device wafer 10. It suffices for the adhesive to have an adhesive force which is lowered when an external stimulus is applied thereto, regardless of the kind of the external stimulus. For instance, an adhesive whose adhesive force is lowered by heating may be used. In the case where the external stimulus is not irradiation with UV rays, the plate 20 need not be formed from a UV-transmissive material. In such a case, therefore, the plate 20 may be formed of silicon, for example.

In the dicing step, it suffices for the cutting blade 52 to cut into the film 90 to such a depth that the film 90 can be completely cut so as to be dividable into a plurality of films 95. Thus, the cutting blade 52 may cut into the plate 20 as well, or may not cut into the plate 20. If the cutting blade 52 does not cut into the plate 20, the plate 20 can be reused, which is preferable in view of a reduced cost. The method of dividing the device wafer 10 in the dicing step is not restricted to the method of cutting with the cutting blade 52, but other methods may also be used, for example, a method of irradiating with a laser beam.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a device wafer having devices formed respectively in regions sectioned by a plurality of intersecting division lines on a front side thereof, the method comprising:
   a groove forming step of forming grooves along the division lines from the front side of the device wafer, the grooves having a depth of not smaller than a finished thickness of the device wafer;
   a plate attaching step of attaching a plate to the front side of the device wafer through an adhesive after the groove forming step is conducted;
   a grinding step of holding the device wafer by a holding table through the plate so as to expose a back side of the device wafer, and grinding the back side of the device wafer by grinding means to thin the device wafer down to the finished thickness, thereby exposing the grooves at the back side of the device wafer and dividing the device wafer into individual chips;
   a film attaching step of attaching a film to the back side of the device wafer after the grinding step is conducted;
   a dicing step of dicing, after the film attaching step is conducted, the film along the division lines from the side of the back side of the device wafer so as to form the plurality of chips each having the film attached to a back side thereof; and
   a picking-up step of picking up the individual chips from the plate after the dicing step is conducted;
   wherein the adhesive is an adhesive having an adhesive force lowered when ultraviolet light is applied thereto; and
   the chips are picked up after the ultraviolet light is applied to the adhesive, in the picking-up step;
   further wherein in the picking-up step, a first one of the chips that is picked up through application of the ultraviolet light to that region of the adhesive which corresponds to the first one of the chips, the ultraviolet light being applied through a mask that only exposes the first one of the chips, and thereafter a second one of the chips that is to be picked up next is picked up through application of the ultraviolet light to that region of the adhesive which corresponds to the second one of the chips, the ultraviolet light being applied by moving the mask to expose only the region of the second one of the chips.

\* \* \* \* \*